(12) United States Patent
Pelrine et al.

(10) Patent No.: US 7,804,227 B2
(45) Date of Patent: Sep. 28, 2010

(54) TEAR RESISTANT ELECTROACTIVE POLYMER TRANSDUCERS

(75) Inventors: Ronald E. Pelrine, Longmont, CO (US);
Roy D. Kornbluh, Palo Alto, CA (US);
Harsha Prahlad, Cupertino, CA (US);
Sunity K. Sharma, Fremont, CA (US);
Bryan Chavez, Palo Alto, CA (US);
Donald E. Czyzyk, Santa Clara, CA (US); Annjoe Wong-Foy, San Francisco, CA (US); Scott E. Stanford, Mountain View, CA (US)

(73) Assignee: SRI International, Menlo Park, CA (US)

( * ) Notice: Subject to any disclaimer, the term of this patent is extended or adjusted under 35 U.S.C. 154(b) by 185 days.

(21) Appl. No.: 12/048,149

(22) Filed: Mar. 13, 2008

(65) Prior Publication Data

US 2008/0224564 A1    Sep. 18, 2008

Related U.S. Application Data

(60) Provisional application No. 60/895,205, filed on Mar. 16, 2007.

(51) Int. Cl.
*H01L 41/04* (2006.01)
(52) U.S. Cl. ...................... 310/330; 310/800
(58) Field of Classification Search ................ 310/324, 310/330–332, 800
See application file for complete search history.

(56) References Cited

U.S. PATENT DOCUMENTS

| 5,977,685 | A | * | 11/1999 | Kurita et al. ............... 310/311 |
| 7,049,732 | B2 | | 5/2006 | Pei et al. |
| 2001/0035723 | A1 | | 11/2001 | Pelrine et al. |
| 2004/0263028 | A1 | * | 12/2004 | Pei et al. .................. 310/800 |
| 2006/0238066 | A1 | | 10/2006 | Pelrine et al. |

FOREIGN PATENT DOCUMENTS

| WO | WO 2008/112583 | 9/2008 |
| WO | WO 2008/115825 | 9/2008 |

OTHER PUBLICATIONS

International Search Report dated Jul. 30, 2008 in PCT Application No. PCT/US08/57121.
Written Opinion dated Jul. 30, 2008 in PCT Application No. PCT/US08/57121.

* cited by examiner

*Primary Examiner*—Walter Benson
*Assistant Examiner*—Derek J Rosenau
(74) *Attorney, Agent, or Firm*—Beyer Law Group LLP

(57) ABSTRACT

Described herein are several solutions that increase transducer lifetime by reducing or preventing tear propagation in a compliant electroactive polymer. One solution couples a compliant tear resistant treatment to a transducer proximate to an edge portion of the electroactive polymer. Another solution uses a tear resistant layer that couples to and covers a large surface area of the transducer. Another suitable tear resistant solution provides added material outside an active area; the added material reduces stress or strain variations in polymer material outside the active area when the electroactive polymer transducer is deflected or pre-strained.

20 Claims, 8 Drawing Sheets

TEAR RESISTANT ELECTROACTIVE POLYMER TRANSDUCERS

CROSS-REFERENCE TO RELATED APPLICATIONS

This application claims priority under 35 U.S.C. §119(e) to U.S. Provisional Patent Application No. 60/895,205 filed on Mar. 16, 2007, which is incorporated by reference herein for all purposes.

FIELD OF THE INVENTION

The present invention relates to electroactive polymer transducers. In particular, the invention relates to techniques for extending the life an electroactive polymer transducer.

BACKGROUND

Over the past decade, compliant electroactive polymer transducers have emerged from the lab to commercial adoption. Their compliance permits much larger deflections than their piezoelectric predecessors, and enables use in countless new applications.

While many compliant electroactive polymer transducers may last for millions of cycles, the technology is still maturing and some compliant polymers may prematurely and unpredictably fail. A lack of product reliability affects consumer confidence in these new compliant transducers and threatens both early and widespread adoption. Unfortunately, the underlying causes behind the premature failures are not singular, straightforward, or well understood. Techniques that increase transducer lifetime and reliability would be greatly appreciated.

SUMMARY

Described herein are several solutions that increase transducer lifetime by reducing or preventing tear propagation in a compliant electroactive polymer. One solution couples a compliant tear resistant treatment to a transducer proximate to an edge portion of the electroactive polymer. Another solution uses a tear resistant layer that couples to and covers a large surface area of the transducer. Another suitable tear resistant solution provides added material outside an active area; the added material reduces stress or strain variations in polymer material outside the active area when the electroactive polymer transducer is deflected or pre-strained.

In one aspect, the present invention relates to an electroactive polymer transducer for converting between electrical and mechanical energy. The transducer includes an electroactive polymer, a first electrode and a second electrode. The first electrode is electrically coupled to a first portion of a first surface of the electroactive polymer. The second electrode is electrically coupled to a second portion of a second surface of the electroactive polymer. The transducer also includes compliant means for preventing a tear from propagating in the electroactive polymer.

In another aspect, the present invention relates to an electroactive polymer transducer that includes an electroactive polymer, a first electrode and a second electrode. The transducer also includes a compliant and tear resistant treatment mechanically coupled to a portion of a first surface or a second surface of the electroactive polymer.

In yet another aspect, the present invention relates to an electroactive polymer transducer. The transducer includes an electroactive polymer, a first electrode and a second electrode. The transducer also includes a compliant and tear resistant layer that mechanically couples to and substantially overlaps a first surface or a second surface of the transducer.

In still another aspect, the present invention relates to a transducer that includes an electroactive polymer, a first electrode and a second electrode. The first electrode and second electrode contribute to define an active area. The transducer also includes added material coupled to the electroactive polymer and disposed outside polymer material in the active area. The added material is configured to reduce stress or strain in electroactive polymer material outside the active area when the electroactive polymer transducer is deflected or pre-strained In another aspect, the present invention relates to a method of manufacturing an electroactive polymer transducer. The method includes adding a first electrode to a first surface of an electroactive polymer. The method also includes adding a second electrode to a second surface of the electroactive polymer. The method further includes adding a compliant and tear resistant treatment to the transducer.

These and other features of the present invention will be described in the following description of the invention and associated figures.

DETAILED DESCRIPTION OF THE PREFERRED EMBODIMENTS

Figure 1A:
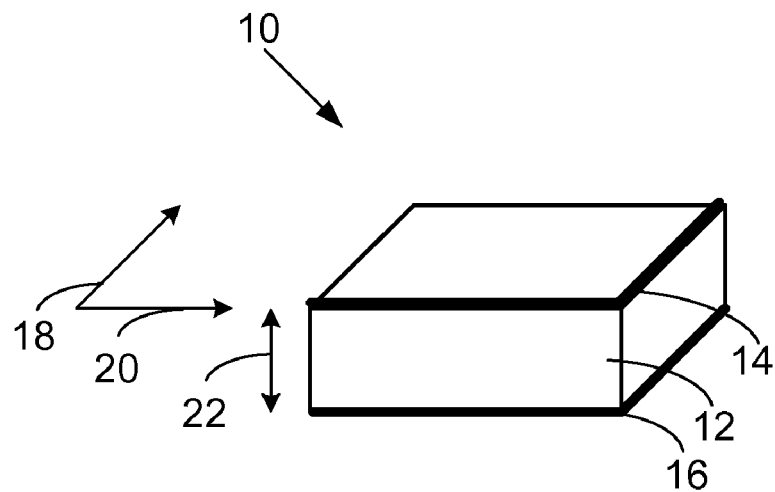
FIGS. 1A and 1B illustrate an electroactive polymer transducer portion with and without deflection in accordance with one embodiment of the present invention.

The present invention is described in detail with reference to several embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The inventors have discovered that a significant number of electroactive polymer transducer failures result from propagating cracks and tears the polymer. The tears often initiate at a polymer edge. Since the polymer is compliant and stretched regularly during usage or maintained at a high state of stretch for long periods of time, a small tear or crack proximate to an edge may eventually grow and propagate across and throughout the compliant polymer, resulting in transducer failure. This type of failure is believed responsible for a significant number of both shelf-life failures and operational failures.

Described herein are numerous solutions to address and reduce electroactive polymer tearing. In one tear resistant embodiment, an electroactive polymer transducer includes a compliant and tear resistant treatment coupled to the electroactive polymer. The tear resistant treatment is itself compliant and does not compromise low stiffness or performance of the compliant transducer. The treatment may be fully or partially applied to a transducer surface. Partial treatment may include a tear resistant treatment added proximate to an edge portion of the electroactive polymer. This edge embodiment is described further with respect to FIGS. 2 and 4. In another embodiment, transducer lifetime is improved with the use of a compliant and tear resistant layer that overlaps an active area or another large surface portion of a transducer. Again, the tear resistant layer is compliant and does not compromise transducer performance. This tear resistant layer embodiment is described further with respect to FIGS. 3-4. Another embodiment adds material at the outer lateral and unconstrained portions of an electroactive polymer; the added material reduces elastic stress and planar strains in the electroactive polymer material—particularly at the edges—when the electroactive polymer transducer is deflected or pre-strained. This approach ensures that the corresponding edge portions of the electroactive polymer do not see large strain variations during usage or during high states of stretch. This added material embodiment is described further with respect to FIGS. 6-8. Each of these solutions has been shown to increase transducer lifetime and improve reliability. A single transducer may include a combination of these tear resistant defenses.

Before committing to a detailed discussion on each of these tear resistant solutions, electroactive polymer transducers will first be discussed.

Figure 1B:
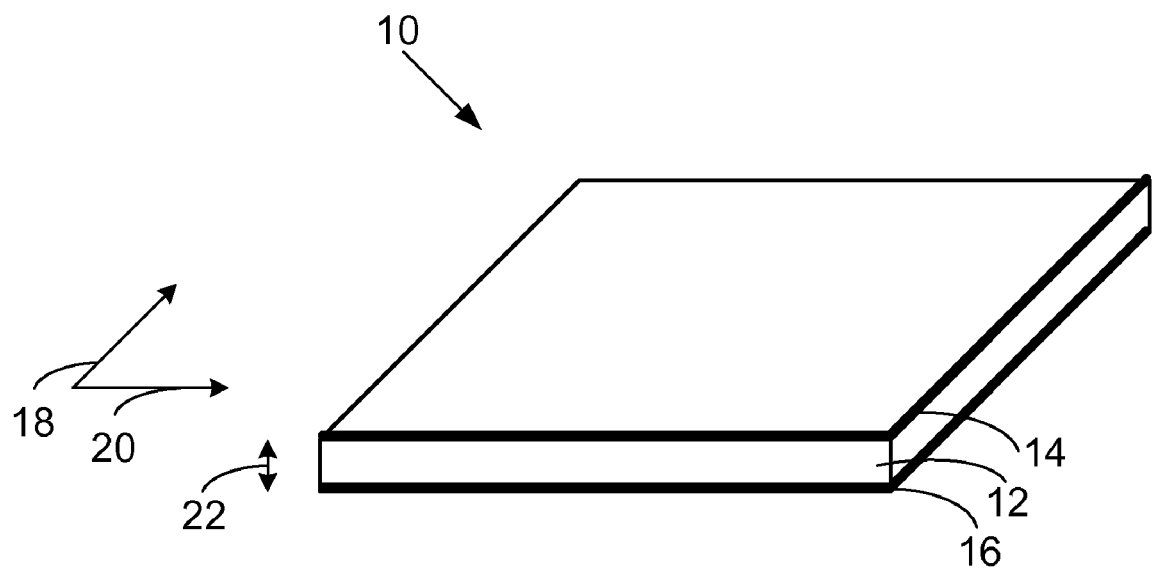

The transformation between electrical and mechanical energy in a compliant electroactive polymer transducer and devices is based on elastance of an electroactive polymer and energy conversion of one or more portions of the polymer. FIG. 1A illustrates a top perspective view of a transducer portion 10, before deflection. FIG. 1B shows transducer portion 10 with deflection.

The transducer portion 10 comprises an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes. Polymer 12 is in electrical communication with electrodes 14 and 16. More specifically, top and bottom electrodes 14 and 16 directly attach to electroactive polymer 12 on its top and bottom surfaces, respectively, to provide a voltage difference across a portion of the polymer 12. Polymer 12 deflects with a change in electric field provided by the top and bottom electrodes 14 and 16. Deflection of the transducer portion 10 in response to a change in electric field provided by the electrodes 14 and 16 is referred to as actuation. As the polymer 12 changes in size, the deflection may be used to produce mechanical work.

FIG. 1B shows transducer portion 10 with deflection. In general, deflection refers to any displacement, expansion, contraction, bulging, torsion, linear or area strain, or any other deformation of a portion of the polymer 12. The change in electric field corresponding to the voltage difference applied to or by the electrodes 14 and 16 produces mechanical pressure within polymer 12. In this case, the unlike electrical charges produced by electrodes 14 and 16 attract each other and provide a compressive force between electrodes 14 and 16 and an expansion force on polymer 12 in planar directions 18 and 20, causing polymer 12 to compress between electrodes 14 and 16 and stretch in the planar directions 18 and 20.

After application of the voltage between electrodes 14 and 16, polymer 12 expands (stretches) in both planar directions 18 and 20. In some cases, polymer 12 is incompressible, e.g. has a substantially constant volume under stress. For an incompressible polymer 12, polymer 12 decreases in thickness as a result of the expansion in the planar directions 18 and 20. It should be noted that transducers used herein are not limited to incompressible polymers and deflection of the polymer 12 may not conform to such a simple relationship.

In general, the transducer portion 10 continues to deflect until mechanical forces balance the electrostatic forces driving the deflection. The mechanical forces include elastic restoring forces of the polymer 12 material, the compliance of electrodes 14 and 16, and any external resistance provided by a device and/or load coupled to the transducer portion 10, etc. The deflection of the transducer portion 10 as a result of the applied voltage may also depend on a number of other factors such as the polymer 12 dielectric constant and the size of polymer 12.

Application of a relatively large voltage difference between electrodes 14 and 16 on the transducer portion 10 shown in FIG. 1A thus causes transducer portion 10 to change to a thinner, larger area shape as shown in FIG. 1B. In this manner, the transducer portion 10 converts electrical energy to mechanical energy. The use of transducer portion 10 as a generator to convert mechanical energy to electrical energy will be described below.

As shown in FIGS. 1A and 1B, electrodes 14 and 16 cover the entire portion of polymer 12 as shown. More commonly, electrodes 14 and 16 cover a limited portion of polymer 12 relative to the total surface area of the polymer. This may be done to prevent electrical breakdown around the edge of polymer 12, for example. Electrodes may also be patterned with special shapes to achieve customized surface deflections. For brevity, only transducers that employ two electrodes are described in detail; however, it is possible to use more than two or less than two electrodes for transducers described herein, including those that do not use any surface electrodes. Non-contact electrodes are described in commonly owned U.S. Pat. No. 6,707,236, which is incorporated by reference in its entirety for all purposes.

As the term is used herein, an active area refers to a portion of a transducer comprising polymer material 12 and at least two electrodes. When the active area is used to convert electrical energy to mechanical energy, the active area includes a portion of polymer 12 having sufficient electrostatic force to enable deflection of the portion. When the active area is used to convert mechanical energy to electrical energy, the active area includes a portion of polymer 12 having sufficient deflection to enable a change in electrostatic energy. An electroactive polymer transducer may have multiple active areas.

Generally, polymers that are suitable for use with transducers of this invention include any substantially insulating polymer or rubber (or combination thereof) that deforms in response to an electrostatic force or whose deformation results in a change in electric field. Preferably, the polymer's deformation is reversible over a wide range of strains. Many elastomeric polymers may serve this purpose. In designing or choosing an appropriate polymer, one may consider the optimal material, physical, and chemical properties. Such properties can be tailored by judicious selection of monomer (including any side chains), additives, degree of cross-linking, crystallinity, molecular weight, etc.

Polymer 12 may assume many different physical and chemical states. For example, the polymer may be used with or without additives such as plasticizers. And they may be monolithic polymeric sheets or combinations of polymers such as laminates or patchworks. Further, the polymers may exist in a single phase or multiple phases. One example of a multiphase material is a polymeric matrix having inorganic filler particles admixed therewith.

One suitable commercially available electroactive polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Suitable actuation voltages for electroactive polymers, or portions thereof, may vary based on the material properties of the electroactive polymer, such as the dielectric constant, as well as the dimensions of the polymer, such as the thickness of the polymer film. For example, actuation electric fields used to actuate polymer 12 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

In one embodiment, polymer 12 is compliant and selected based on its elastance. A modulus of elasticity for polymer 12 less than about 100 MPa is suitable for many embodiments. In one specific embodiment, electroactive polymer 12 includes an elastic modulus less than 40 MPa. In another specific embodiment, electroactive polymer 12 is relatively compliant and includes an elastic modulus less than 10 MPa.

Transducers and polymers suitable for use herein are not limited to any particular geometry or type of deflection. For example, the polymer and electrodes may be formed into any geometry or shape including tubes and rolls, stretched polymers attached between multiple rigid structures or members, across a frame having one or more holes or joints, etc. Deflection of a transducer may include linear expansion and/or compression in one or more directions, bending, axial deflection when the polymer is rolled, deflection out of a hole provided in a substrate, etc. Deflection of a transducer may be affected by how the polymer is constrained by a frame, rigid structures attached to the polymer, or stiffened portions of the polymer (e.g., via curing or a laminate).

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers. Of course, a polymer may deflect with a strain less than the maximum, and the strain may be adjusted by adjusting the applied voltage. For some pre-strained polymers, maximum linear strains of at least about 100 percent are common For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 18 and 20 in FIGS. 1A and 1B, per unit area of the polymer upon actuation relative to the unactuated state. Maximum area strains of at least about 100 percent are possible for pre-strained polymers. For some pre-strained polymers, maximum area strains in the range of 70 to 330 percent are common.

The electrodes 14 and 16 are compliant and conform to the changing shape of the polymer. As electroactive polymers may deflect at high strains, electrodes attached to the polymers should deflect without compromising mechanical or electrical performance. Generally, electrodes suitable for use herein may be of any shape and material provided that they are able to supply a suitable voltage to, or receive a suitable voltage from, an electroactive polymer. The voltage may be either constant or varying over time. In one embodiment, the electrodes adhere directly to a surface of the polymer. In another embodiment, the electrodes indirectly couple to the polymer through an intermediate layer such as a tear resistance layer described below (see FIG. 4A). The electrodes may be only applied to a portion of an electroactive polymer surface and help define an active area according to their geometry. The electrodes may also be patterned to achieve a desired shape for a surface feature created by deflection of the polymer.

Various types of electrodes suitable for use herein are described in commonly owned U.S. Pat. No. 6,376,971, which is incorporated by reference herein for all purposes. Suitable electrodes include structured electrodes comprising metal traces and charge distribution layers, textured electrodes, conductive greases such as carbon greases or silver greases, colloidal suspensions, high aspect ratio conductive materials such as carbon fibrils and carbon nanotubes, and mixtures of ionically conductive materials. Materials used for electrodes 14 and 16 may vary. Suitable materials used in an electrode may include graphite, carbon black, colloidal suspensions, silver filled and carbon filled gels and polymers, gelatin, and ionically or electronically conductive polymers. In a specific embodiment, an electrode suitable for use a transducer includes 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease. It is understood that certain electrode materials may work well with particular polymers and may not work as well for others. In some cases, a transducer may implement two different types of electrodes, e.g., a different electrode type for each active area or different electrode types on opposing sides of a polymer.

FIGS. 1A and 1B may also be used to show one manner in which the transducer portion 10 converts mechanical to electrical energy. For example, if the transducer portion 10 is mechanically stretched to a thinner, larger area shape such as that shown in FIG. 1B, and a relatively small voltage difference (less than that necessary to actuate the film to the configuration in FIG. 1B) is applied between electrodes 14 and 16, transducer portion 10 will contract in area between the electrodes to a shape such as in FIG. 1A when the external forces are removed. Stretching the transducer refers to deflecting the transducer to result in a larger net area between the electrodes, e.g. in the plane defined by directions 18 and 20 between the electrodes. Once transducer portion 10 is stretched, the relatively small voltage difference is provided such that the resulting electrostatic forces are insufficient to balance the elastic restoring forces of the stretch. Transducer portion 10 therefore contracts, and it becomes thicker and has a smaller planar area in the plane defined by directions 18 and 20 (orthogonal to the thickness 22 between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting as a generator. In addition to the elastic restoring forces, external forces from the mechanical transmission can also be used to assist the polymer in returning to its unstretched state.

In some cases, transducer portion 10 may be described electrically as a variable capacitor. The capacitance decreases for the shape change going from that shown in FIG. 1B to that shown in FIG. 1A. Typically, the voltage difference between electrodes 14 and 16 will be raised by contraction. This is normally the case, for example, if additional charge is not added or subtracted from electrodes 14 and 16 during the contraction process. The increase in electrical energy, U, may be illustrated by the formula $U=0.5\ Q^2/C$, where Q is the amount of positive charge on the positive electrode and C is the variable capacitance which relates to the intrinsic dielectric properties of polymer 12 and its geometry. If Q is fixed and C decreases, then the electrical energy U increases.

The increase in electrical energy and voltage can be recovered or used in a suitable device or harvesting circuitry in electrical communication with electrodes 14 and 16. In addition, transducer portion 10 may be mechanically coupled to mechanical transmission system that deflects the polymer and provides mechanical energy. The harvesting circuitry may remove some or all of the charge and energy when the transducer portion 10 is fully contracted in the plane defined by directions 18 and 20. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 10 when operating as a generator depends on any electrical and mechanical loading as well as the intrinsic properties of polymer 12 and electrodes 14 and 16.

Electronic drivers are typically connected to the electrodes. The voltage provided to an electroactive polymer will depend upon specifics of a transducer and application. In one embodiment, a transducer is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

Figure 1C:
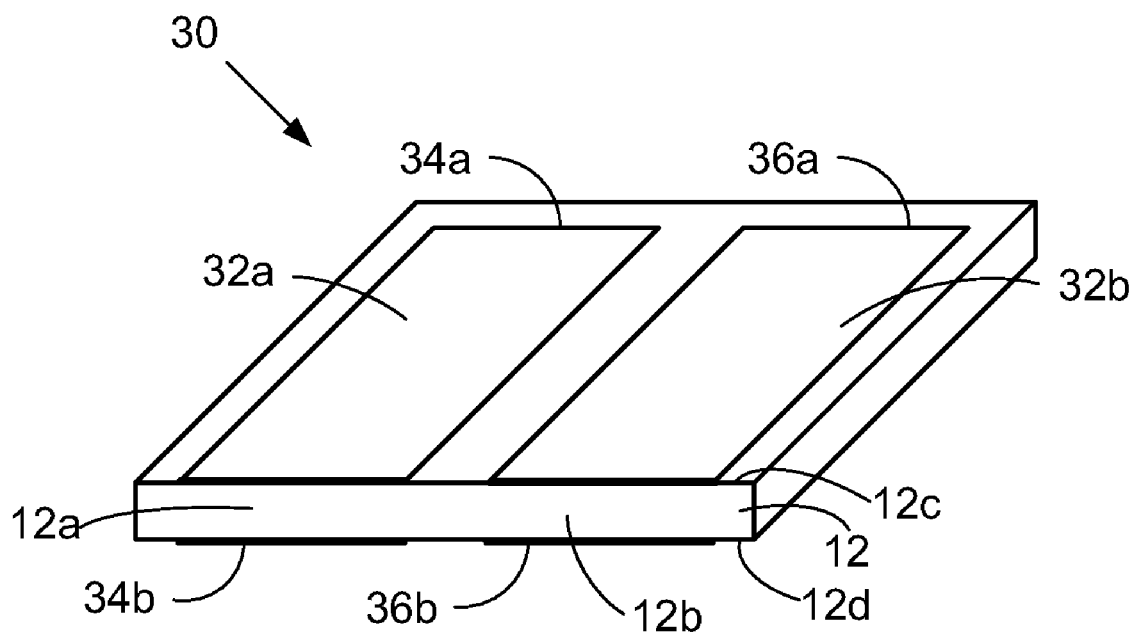
FIG. 1C illustrates a monolithic transducer comprising a plurality of active areas in accordance with a specific embodiment of the present invention.

The term "monolithic" is used herein to refer to electroactive polymers, transducers, and devices comprising a plurality of active areas on a single polymer. FIG. 1C illustrates a monolithic transducer 30 comprising a plurality of active areas 32a and 32b in accordance with a specific transducer embodiment.

Active area 32a has top and bottom electrodes 34a and 34b that are attached to polymer 12 on its top and bottom surfaces 12c and 12d, respectively. The electrodes 34a and 34b provide a voltage difference across a portion 12a of polymer 12. The portion 12a deflects with a change in electric field provided by the electrodes 34a and 34b. More specifically, portion 12a expands in the plane and thins vertically—or orthogonal to the plane—with a suitable voltage difference across a portion 12a. The portion 12a comprises the polymer 12 between the electrodes 34a and 34b and any other portions of the polymer 12 having sufficient stress induced by the electrostatic force to enable deflection and thinning upon application of voltages using the electrodes 34a and 34b.

Active area 32b has top and bottom electrodes 36a and 36b that are attached to the polymer 12 on its top and bottom surfaces 12c and 12d, respectively. The electrodes 36a and 36b provide a voltage difference across a portion 12b of polymer 12. The portion 12b deflects with a change in electric field provided by the electrodes 36a and 36b. More specifically, portion 12a expands in the plane and thins vertically—or orthogonal to the plane—with a suitable voltage difference across a portion 12a. The portion 12b comprises polymer 12 between the electrodes 36a and 36b and any other portions of the polymer 12 having sufficient stress induced by the electrostatic force to enable deflection upon application of voltages using the electrodes 36a and 36b.

Active areas 32a and 32b permit independent control via their respective electrodes. Thus, in conjunction with suitable control electronics, active areas 32a and 32b may be actuated individually, simultaneously, intermittently, etc.

So far, electrodes on opposite surfaces of an electroactive polymer described so far have been symmetrical in size, shape and location. Electrodes on opposite sides of a transducer are not limited to symmetrical designs or layouts and may have different sizes, shapes, types, and/or locations on opposite surfaces of a polymer. Electrodes on a polymer may be patterned as desired. For example, one or more electrodes may be sprayed onto a surface of a polymer in the shape determined by a mask or stencil. Different masks may be used for each polymer surface. Customized electrode shape allows customized deflections from a polymer portion. Control of electrodes for each active area then allows each custom-patterned active area to be activated individually, simultaneously, intermittently, etc.

Referring back to FIGS. 1A and 1B, Electroactive polymer 12—or one or more portions thereof—may include pre-strain. For many polymers, pre-strain improves conversion between electrical and mechanical energy. The improved mechanical response enables greater mechanical work for an electroactive polymer, e.g., larger deflections and actuation pressures. In one embodiment, the pre-strain is elastic. In principle, an elastically pre-strained polymer may have any forces or alterations that maintain the pre-strain removed and return to its original unstrained state. The pre-strain may comprise elastic deformation of polymer 12 and be formed, for example, by stretching the polymer in tension and applying one or more of the techniques described herein while the polymer is stretched.

Pre-strain of a polymer may be described, in one or more directions, as the change in dimension in a direction after pre-straining relative to the dimension in that direction before pre-straining. In one embodiment, pre-strain is applied uniformly over a portion of polymer 12 to produce an isotropic pre-strained polymer. By way of example, an acrylic elastomeric polymer may be stretched by 200 to 400 percent in both planar directions 18 and 20 (FIG. 1A). In another specific embodiment, pre-strain is applied unequally in different directions for a portion of polymer 12 to produce an anisotropic pre-strained polymer. In this case, polymer 12 may deflect greater in one direction than another when actuated. In some cases, deflection in direction 18 of transducer portion 10 may be enhanced by employing a large pre-strain in perpendicular direction 20. For example, an acrylic elastomeric polymer used as the transducer portion 10 may be stretched by 10 percent in direction 18 and by 500 percent in the perpendicular direction 20. Pre-strain suitable for use herein is further described in commonly owned, U.S. Pat. No. 6,545,384, which is incorporated by reference in its entirety for all purposes.

Having discussed compliant electroactive polymer transducers in sufficient detail, solutions for tear resistance will now be expanded upon.

Figure 2A:
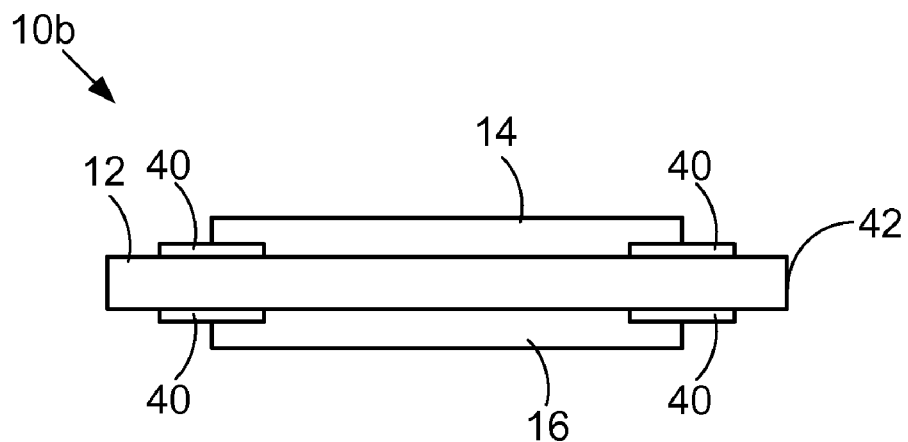
FIGS. 2A and 2B show a side cross-sectional view and a top elevated view of an electroactive polymer transducer including a compliant tear resistant treatment in accordance with one embodiment of the present invention.
Figure 2B:
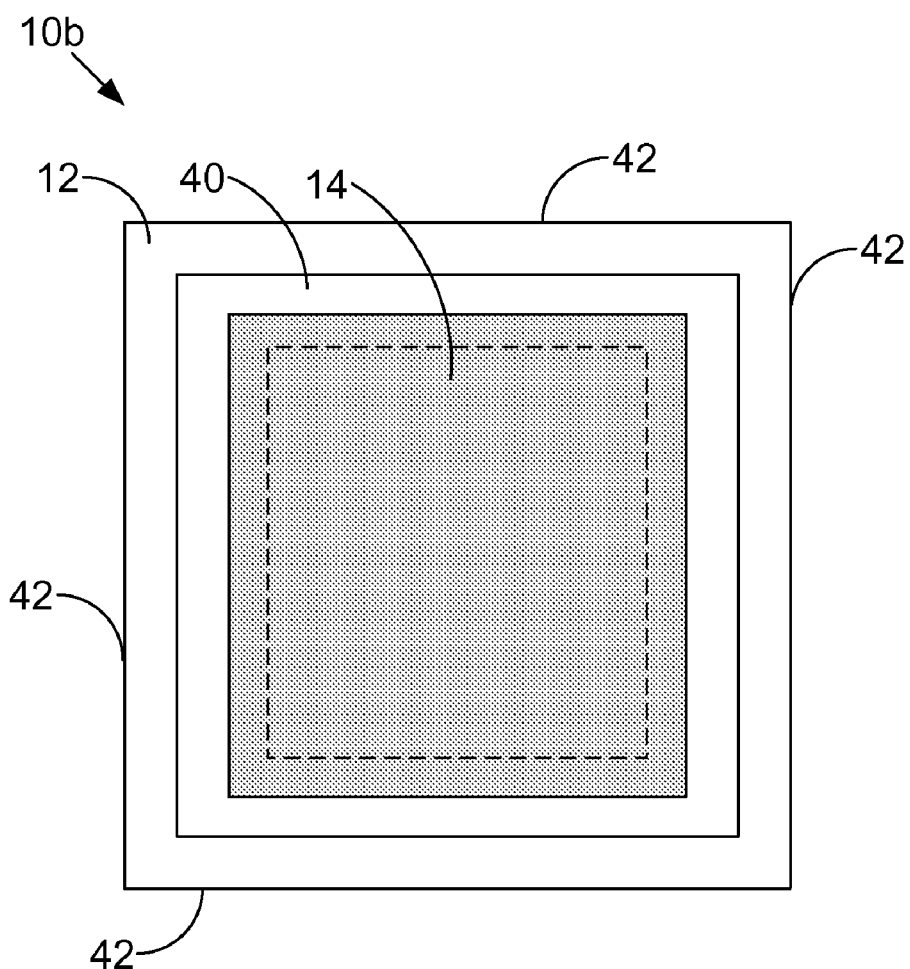

One tear resistant embodiment uses a compliant and tear resistant treatment coupled proximate to an edge portion of the electroactive polymer. FIGS. 2A and 2B show a compliant tear resistant treatment 40 included with an electroactive polymer transducer 10b in accordance with one embodiment of the present invention.

Tear resistant treatment 40 is coupled directly to transducer 10b proximate to an edge portion 42 of the electroactive polymer 12. An edge refers to a side of the polymer; since compliant electroactive polymers are generally formed as thin sheets or films, the thin sheet geometry of the polymer sheet can be represented as two primary surfaces (e.g., top and bottom surfaces in FIG. 2A) and a number of sides (e.g., four in FIG. 2B) or 'edges' due to the thin profile and primarily planar geometry of the polymer. Since a polymer sheet may be manufactured or cut into any two-dimensional (2D) shape, the planar sheet geometry may thus include any 2D shape and the edges may take any geometry, accordingly.

'Proximate to the edge portion' implies that the tear resistant treatment 40 may be located right at the polymer edge, or close to it. In one embodiment, a portion or all of the tear resistant treatment 40 is disposed (from a surface perspective) between an outermost planar portion of an electrode and the polymer edge. An edge treatment 40 may also overlap one or more outer portions electrodes 14 and 16. In the embodiment shown in FIGS. 2A and 2B, tear resistant treatment 40 overlaps electrodes 14 and 16 and does not fully extend to the polymer edge 42. Portions of treatment 40 may also extend completely to edge 42. Other proximate geometries are contemplated and suitable for use.

In general, a partial treatment 40 can be located anywhere on the transducer such that it prevents tear propagation, either from an external edge inward or other tear locations in the polymer. Partial tear resistant treatment 40 may take any planar shape or configuration on the polymer surface. For example, a treatment 40 may perimetrically border each active area for the monolithic polymer of FIG. 1C. Other partial treatment 40 configurations are suitable for use and contemplated. In a specific embodiment, a tear resistant treatment is added proximate to locations of attachment to the polymer to minimize damage caused by high stresses at these locations.

So far, tear resistant treatment 40 has only been applied to a portion of the polymer. Blanket treatments are also suitable for use with many electroactive polymer transducers 10. A tear resistant treatment 40 is referred to herein as a 'tear resistant layer' when the treatment is applied to an entire transducer 10 surface or a substantially large portion of the transducer surface. This may be done for one surface or both polymer surfaces.

Figure 3:
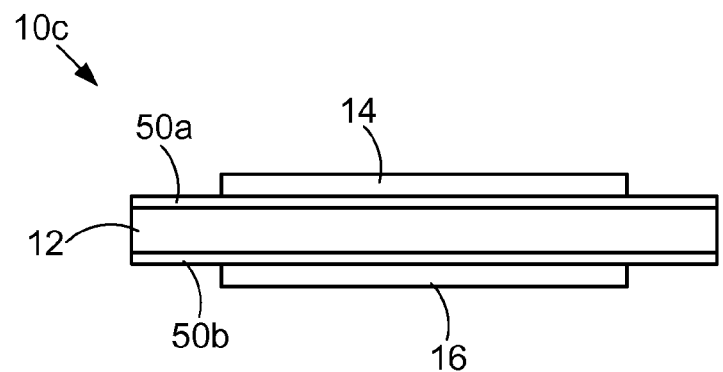
FIG. 3 shows an electroactive polymer transducer with a compliant tear resistant layer in accordance with another embodiment of the present invention.

FIG. 3 shows an electroactive polymer transducer 10c in accordance with another embodiment of the present invention. Transducer 10c includes a tear resistant layer 50a on its top surface and a layer 50b on its opposite bottom surface. Each layer 50 includes a tear resistant treatment 40 disposed over the entire surface of polymer 12, and attached directly to the polymer 12.

Figure 4A:
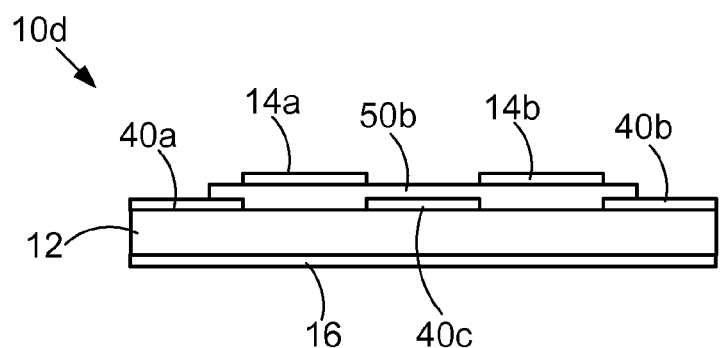
FIGS. 4A and 4B each show a cross section of an electroactive polymer transducer with multiple tear resistant treatments in accordance with two specific embodiments.

An electroactive polymer transducer may include multiple tear resistant treatments. FIG. 4A shows a cross section of an electroactive polymer transducer 10d in accordance with a specific embodiment of the present invention. Transducer 10d includes partial treatments 40a, 40b and 40c, along with tear resistant layer 50b, all on the top surface of polymer 12. Partial treatments 40a and 40b are located at the left and right edges, respectively. A middle partial treatment 40c centrally borders active areas formed by electrodes 14a and 14b. A surface coating treatment layer 50b is applied to transducer 10d. The electrodes 14a and 14b are then added on top of layer 50b, which implies that layer 50b has a suitable conductance to permit electrical communication between electrodes 14a and 14b and polymer 12. Partial treatments 40a, 40b and 40c need not be conductive.

Figure 4B:
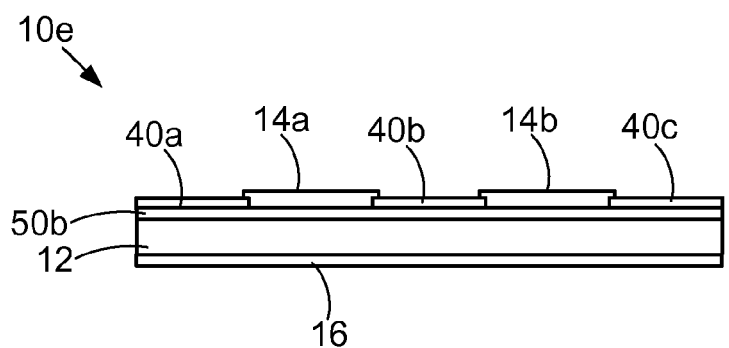

FIG. 4B shows a cross section of an electroactive polymer transducer 10e in accordance with another specific embodiment of the present invention. Transducer 10e is similar to transducer 10d except that surface coating layer 50b is added before, and rests below, partial treatments 40a, 40b and 40c.

A tear resistant treatment 40 (or 50) may include any suitable tear resistant material or combination of materials with a greater tear resistance than the polymer and that does not compromise compliant performance of transducer 10. Preferably, the tear resistant material includes a low stiffness that does not significantly increase stiffness of transducer 10. In one embodiment, treatment 40 includes an elastic modulus less than about 50 MPa. In a specific embodiment, treatment 40 includes an elastic modulus less than about 5 MPa. In some cases, elastic modulus for the tear resistant treatment is matched to the electroactive polymer elastic modulus so as to minimize stresses between the layers during deflection.

In one embodiment, tear resistant treatment 40 includes a single material. In a specific embodiment, the tear resistant overcoat is itself an elastomer with better tear resistance properties than the electroactive polymer being protected. Natural rubber has excellent tear resistance, for example, and is suitable for use with many electroactive polymers, such as acrylics. Natural rubber latex may be painted, sprayed or otherwise deposited onto a polymer and allowed to dry, for example. Natural rubber latex is widely available from a wide variety of vendors, such as TAP Plastics (Mold Builder Liquid Latex Rubber, TAP Plastics, Dublin, Calif.). Another type of rubber that has been shown to have good adhesion to acrylic and good tear resistance is a polychloroprene-based rubber, Fastbond-30-NF, as provided by 3M Corporation of Minneapolis, Minn. Treatments 40 made from polyeurethane adhesives (sometimes diluted in a solvent) have also proven to work well in cases where the tear resistant treatment is applied in regions of low operating strain (as will be described below, it is possible to reduce the operating strain beyond the edges of the active region). In a specific embodiment, a treatment layer 50 consisted of a dilute mixture of Toluene and Sikaflex-brand Polyurethane glue (Sikaflex 201 US or Sikaflex 221 adhesive sealant systems made by Sika Corporation, Madison Heights, Mich.) with or without solids removed through centrifuging and applied before pre-straining the polymer.

In another specific embodiment, tear resistant treatment 40 includes multiple materials and/or composite materials. Composite materials may include a weave, non-woven material, composite laminates, or fibers, for example. The fibers may be arranged as random fibers or textiles. The fibers typically include thin threads with high elastic modulus that do not themselves tear easily. Examples of suitable fibers include nylon or Kevlar. Although they are conductive, graphite or carbon fibers (including nano-sized fibers) may also be used. Random fibers may also be embedded into the electroactive polymer or attached to the surface of the polymer to allow it to still stretch but prevent tear propagation. A textile may include elastic threads, wovens or nonwovens that permit planar stretching. There are numerous possible weaves or braids commercially available. These include elastic bands comprised of elastic fibers and nonelastic fibers that are manufactured for use in garments such as Item # IB015 from Shindo Item Catalog (SIC) made by Shindo Senikogyo Co., Ltd., Fukui, Japan, as one of skill in the art will appreciate. It is also possible to use non-stretchable fibers if they are arranged in a zig-zag configuration. The zig-zag may be a part of a weave or it could be formed by attaching the fiber to the electroactive polymer in a stretched state and allowing the electroactive polymer to relax. A wider fiber or ribbon could also be used. In this case it may tend to buckle or corrugate out of plane when relaxed. The textiles may be woven or otherwise produced to take advantage of the fact that they become narrower as they are stretched. For example, the narrowing while stretching may be used to stretch an electroactive polymer in width not just length.

It is noted than while tear resistant treatment 40 includes a low stiffness, materials included in treatment 40 are not limited to those with a low stiffness. For example, thin strands of Kevlar or nylon are suitable for use in weaves or as randomly oriented fibers in non-woven materials. In this case, the weave includes a low aggregate stiffness that permits compliant interaction with the polymer 12 while constituent fibers of the weave may include an elastic modulus in the GPa range.

As shown in FIGS. 2-4, a tear resistant treatment 40 may be directly or indirectly mechanically coupled to the electroactive polymer. Indirect coupling uses one or more intermediate layers between the tear resistant layer and electroactive polymer. For example, an intermediate layer may be used to improve adhesion between the tear resistant layer and electroactive polymer. An electrode may also be disposed between the tear resistant layer and polymer surface.

Direct coupling typically attaches the tear resistant layer to the electroactive polymer surface. In a specific embodiment, the two are adhered together. The choice of adhesive may be affected by the specific tear resistant treatment 40 material and electroactive polymer material; better attachment and adhesion typically results in better tear resistance. For example, natural rubber and Fastbond 30-NF adhere well to acrylic electroactive polymers and result in good tear resistance. In another specific embodiment, tear resistant treatment 40 chemically bonds to the electroactive polymer 12.

An alternate method of increasing tear resistance of a dielectric elastomer film is to directly modify the chemical structure by introducing compounds that further cross-link the elastomer. For example, polyisocyanates, often found in various commercial polyurethane glues such as Nail Power (OSI Sealants, Mentor, Ohio) will cross-link acrylic elastomer formulations such as 3M VHB 4910. One specific compound, diphenyl-diisocyanate, may be applied to whole sheets of film as well as to localized areas of films. In the simplest practice, the compounds can be directly applied by brushing, dripping, spraying, drawdown bar coating, doctor blading, etc. to the acrylic surface. Those skilled in the art will appreciate that more sophisticated application methods can control the chemical diffusion and penetration of the cross-linking agents to provide a range from stepped to smoothly transitioned areas of non-modified elastomer with modified cross-linked areas. Methods of controlling diffusion include: varying the amounts and types of solvents that are mixed with the compounds, for example.

From a performance perspective, the tear resistant treatment 40 may perform several functions. First, it resists and prevents edge or other local tears from propagating and growing. Second, edge tear resistant treatment 40 may smooth electrical and mechanical stress concentrations at the edge portions of polymer 12. Also, treatment 40 may smooth the electrical field applied between the electrodes by virtue of introducing a high dielectric constant material in the active area, which the electrical field will avoid.

High strains and stresses are often witnessed in an electroactive polymer material outside an active area when the electroactive polymer transducer is deflected or pre-strained. Another tear resistant embodiment adds material to the outer portions of an electroactive polymer to reduce elastic stress or planar strain in these outer portions. This added material approach reduces stress and strain variations in the corresponding portions of the electroactive polymer during deflections or high states of stretch. In one sense, this embodiment is a geometry-based approach during initial selection of polymer shape that adds material and allows for high strain to be maintained in an active area and lower strains in edge portions.

Figure 5:
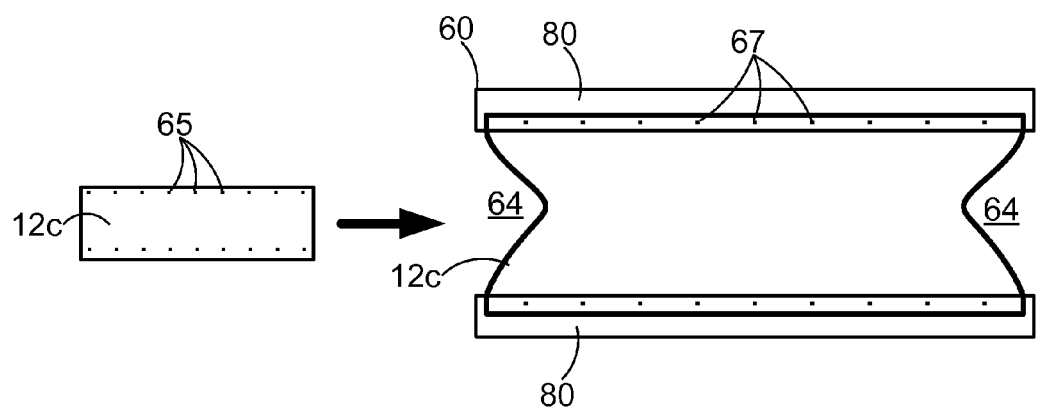
FIG. 5 shows a traditional electroactive polymer included in a linear actuation device, both before and after pre-strain and attachment to a frame.

For contrast, FIG. 5 shows a traditional electroactive polymer 12c included in a linear actuation device, both before and after pre-strain and attachment to a frame 60 that includes two top and bottom rigid members 80. The polymer 12c attaches on its top and bottom portions to members 80, which with suitable adhesive, holds these polymer portions in a constant position despite the strain and stress at the edges. The linear actuator then includes two parallel rigid members 80 that each constrain deflection of the polymer in the horizontal direction but permit deflection of the actuator and transducer in the orthogonal direction.

Registration marks 65 and 67 show the even stretching from an initial unstretched polymer to a second state where the polymer attaches to rigid members 80. In this case, the evenly spaced registration marks 65 on the initial unstretched polymer are linearly related to the evenly spaced registration marks 67 on the pre-strained polymer.

Notably, however, the free and unconstrained lateral edges of the polymer 12c relax inward, as shown, since they are not constrained like the top and bottom edges. There may be a large stress or strain at these unconstrained edges. This large stress may cause tearing.

Figure 6:
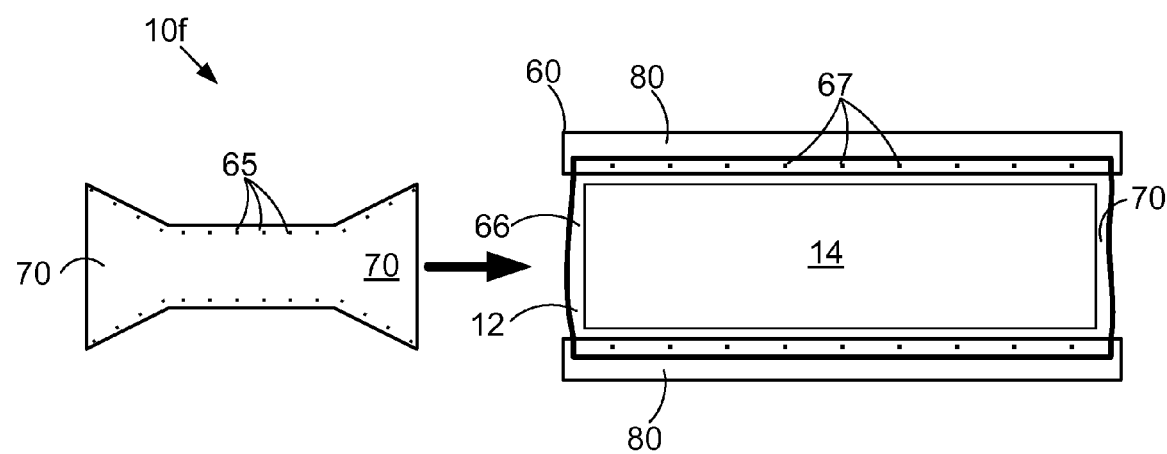
FIG. 6 shows an electroactive polymer transducer with added material in accordance with a specific embodiment of the present invention, both before and after pre-strain and attachment to a frame.

FIG. 6 shows an electroactive polymer transducer 10f in accordance with a specific embodiment of the present invention. After attachment to members 80, transducer 10f includes a pre-strained electroactive polymer 12 and added electroactive polymer material 70.

Added electroactive polymer material 70 is located at lateral portions of polymer 12 that (upon assembly of the actuator) will not be rigidly held and are subject to stress or strain as a result of pre-strain or as a result of deflection (e.g., upward and downward motion of the linear actuator). For the example of FIG. 6, the added electroactive polymer material 70 is included at the lateral sides before pre-straining and stretching deflection, and resembles a bowtie as shown before pre-straining in FIG. 6. For the device in FIG. 5, these lateral portions near 64 will witness variable stress and strain. For transducer 10f, however, the added electroactive polymer material 70 prevents substantial stress or strain variation in the lateral portions by providing extra material to gradually transition to lower stress and strain rates so that there is not a high stress or strain at the edge of the material.

Registration marks 65 and 67 are again used in transducer 10f to show changes in geometry of polymer 12 before and after pre-straining. In one embodiment, the registration marks 65 are evenly spaced before and after pre-straining and can be translating using a linear multiple. However, as shown in FIG. 6, after pre-straining, the added electroactive polymer material 70 bunches and collects in lateral unconstrained regions 66 of the linear actuator.

In another embodiment, the registration marks 65 are unevenly spaced before pre-straining. In other words, the pre-strain is applied such that lateral portions including the added material 70 pre-strain at a different rate than the central portions of the polymer. The differential pre-strain can be greater or less than the central portions. For example, pre-strain for the lateral flares can be less (e.g., half or some other fraction) than the central portions; this further reduces stress and strain on the lateral portions 66 after pre-strain and during deflection.

Added polymer material 70 provides several functions in addition to tear resistance. First, this added polymer material 70 prevents inward bowing of the polymer 12 due to pre-straining as otherwise produced in FIG. 5. Second, if enough material 70 is added, it may also prevent inward contraction of the polymer 12 when the linear actuator including transducer 10e deflects in an orthogonal direction and further stretches the polymer 12 (which would lead to further inward contraction).

An active area for transducer 10f in this case includes a central portion defined roughly by the planar over lap of electrodes 14 and 16 (only 14 is shown in FIG. 6). The active area can still have high strains when the linear actuator is actuated or otherwise stretched in the vertical direction orthogonal to the rigid members. However, because of the added material 70, the strain at the protected edge portions 70 is much lower. At the least, for a given displacement of the transducer and linear actuator, strain in unconstrained regions 66 is less than the central region including the active area, and less than would be seen without the added material 70. As a result, any edge tears or other defects are far less likely to initiate or propagate.

Figure 7:
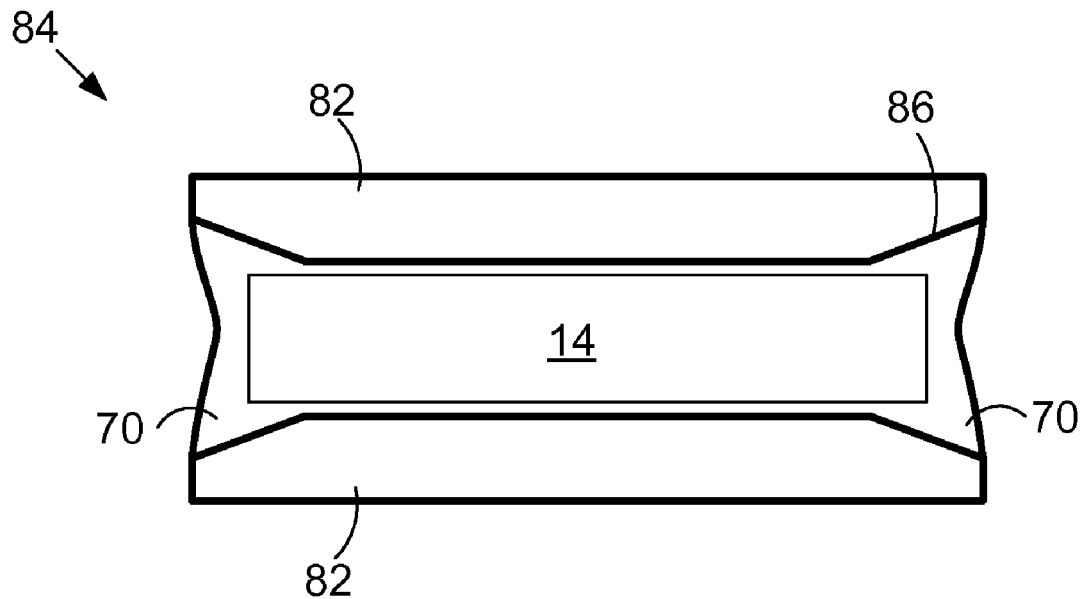
FIG. 7 shows an electroactive polymer transducer in a linear device in accordance with another specific embodiment.

In another added material embodiment, the device is adapted to complement the added material 70. FIG. 7 shows an electroactive polymer transducer in a linear device 84 in accordance with this specific embodiment. Rigid members 82 for device 84 include outer portions with tapered attachment edges 86 to accommodate the added material 70. A central region still includes electrode 14 and its associated active area, but the lateral sides of members 82 are tapered to accommodate added material 70. Again, this is done to allow extra material 70 which reduces the strain during operation and so reduces the likelihood of tears initiating or propagating from an edge of polymer 12 inward, which is common in a linear device such as that shown in FIG. 5 due to the added strain at the lateral edges of polymer 12 during displacement in the vertical direction.

Figure 8:
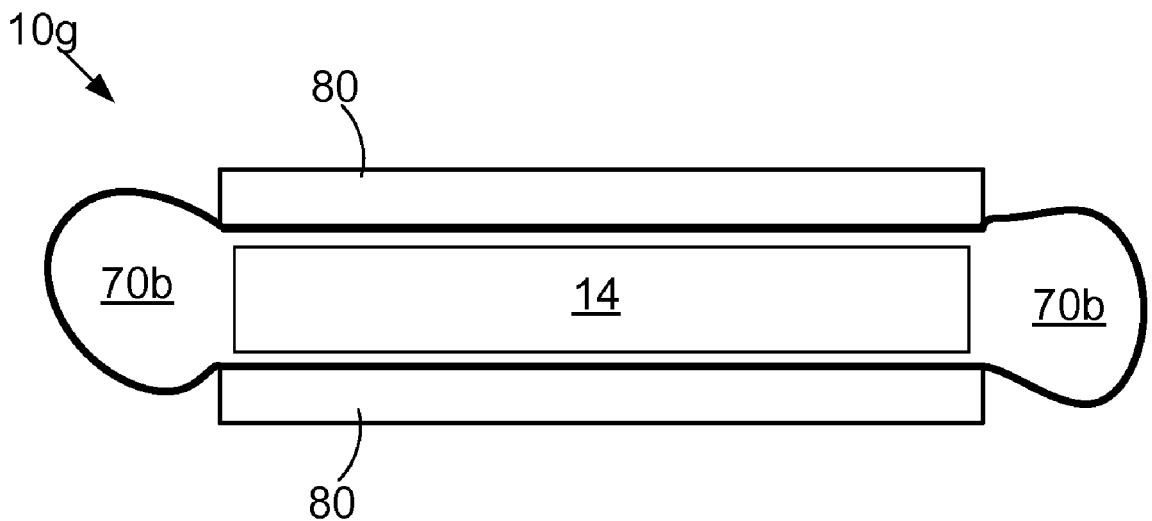
FIG. 8 shows an electroactive polymer transducer with loose added material in accordance with a specific embodiment.

In a loose added material embodiment, enough added material 70 is provided so as to allow a near complete relaxation of the strain at the lateral unconstrained regions 66. FIG. 8 shows an electroactive polymer transducer 10g with loose added material in accordance with this specific embodiment. Transducer 10g includes enough added material 70b such that the added material 70b is still loose or relaxed with no stress for almost any amount of vertical deflection of the linear actuator and transducer 10g. Thus, the pre-straining pattern includes so much added material 70 such that even when the polymer 12 is pre-strained and then later deflected, the added material is still loose or floppy with negligible or zero stress.

In general, added electroactive polymer material 70 may be included in any portions of a polymer 12 that witness stress or strain after pre-strain and/or stress or strain due to deflection and that are not rigidly held during usage.

The amount of added material will determine the reduction in strain and stress. The actual amount included in a specific transducer or device is a matter of design choice. In one embodiment, the amount of pre-strain varies in the device such that the amount of strain on the polymer reduces towards the edges. For example, using the registration marks 67 of FIG. 6, the registration marks 67 may be spaced closer together towards the lateral edges of rigid members 80 after pre-strain. High pre-strain may still be maintained in the central portion to gain the benefits of pre-strain in the active area. This gradual outward reduction, however, reduces strain on the outer lateral portions 66 and avoids any sharp transitions in strain or stress levels across the polymer during actuation.

It is also worth noting that the added material and tear resistance techniques described herein are suitable for use with electroactive polymer devices other than linear actuators. For example, added material 70 may be used with rolled transducers to produce a rolled electroactive polymer transducer with added material that reduces stress and strain variations in circumferential edges for the rolled polymer and prevents tear propagation from these edges, thereby extending life of the roll. Tear resistant treatments may also be added to a rolled transducer.

An electroactive polymer transducer may also employ multiple approaches for tear resistance described above. For example, any of the transducers from FIGS. 6-9 may include one or more (partial and/or full) tear resistant treatments 40 as described above with respect to FIGS. 2-5.

Figure 9:
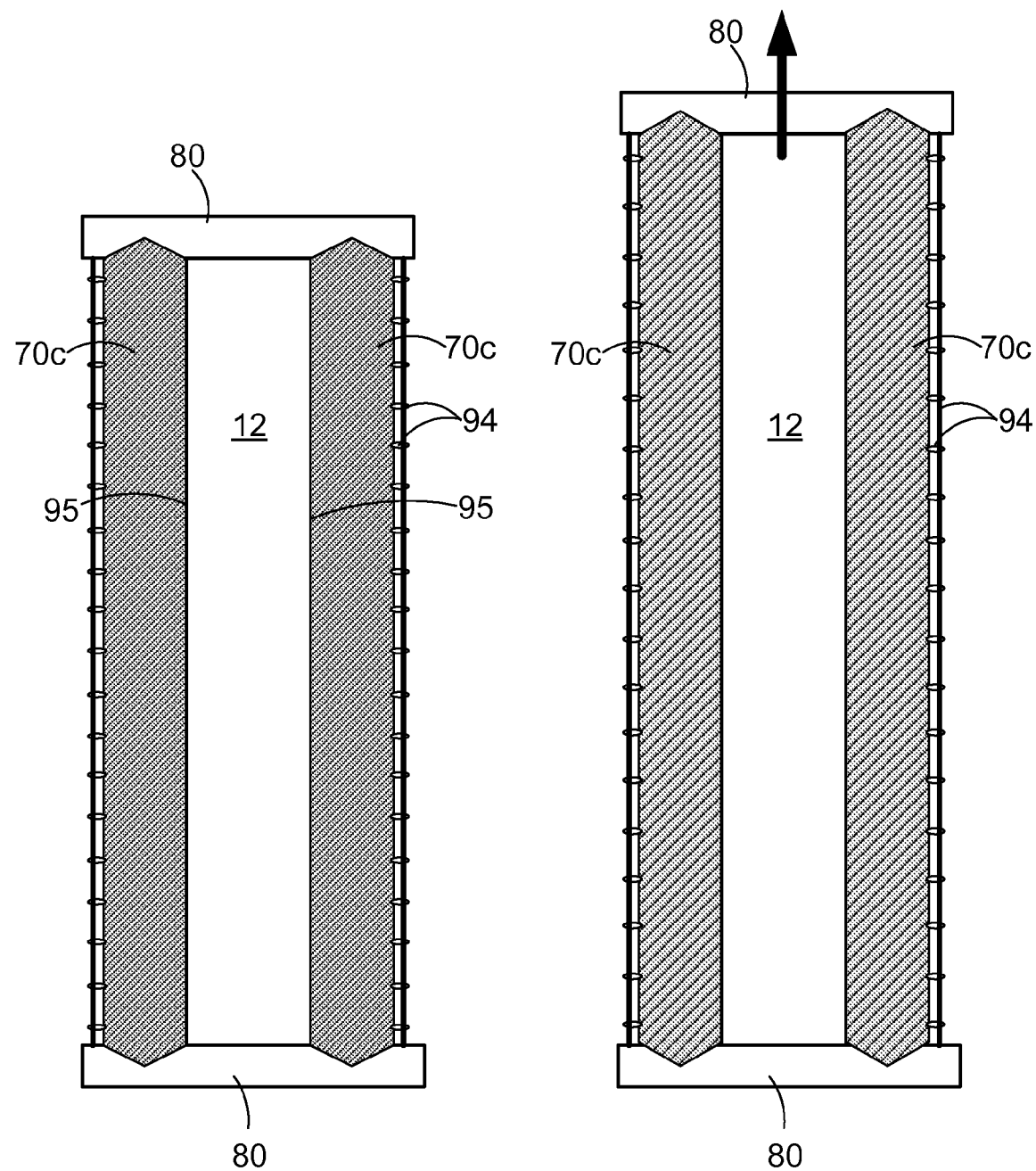
FIG. 9 shows an electroactive polymer transducer in a linear actuation device in accordance with another specific embodiment.

FIG. 9 shows an electroactive polymer device 90 in accordance with another specific embodiment. Device 90 is a linear actuator that includes a planar polymer 12 (or a rolled polymer). Top and bottom rigid members 80 attach to top and bottom portions of polymer 12, respectively.

The added material 70 need not be electroactive polymer material. In this case, a stretchable added material 70c overlaps and attaches to the lateral sides 95 of polymer 12 at the overlap locations. In this case, material 70c includes a non-electroactive polymer material coupled to the electroactive polymer 12 and configured to prevent tears in the polymer 12. Stretchable added material 70c may include a stretchable fabric for example.

First, the overlapping portion and added material 70c (which includes a tear resistant material) acts as a tear resistant treatment disposed at edge portions of polymer 12—according to the geometry of the overlap—as described above with respect to FIG. 2.

Second, a sliding rigid constraint 94 couples to the outer opposite side of stretchable added material 70c and prevents the outer opposite side from buckling inward when pulled. Coupling between the added material 70c and polymer 12 may include an adhesive, for example. Coupling between the added material 70b and the sliding rigid constraint 94 may include sliding hooks for example, that permit vertical motion. In operation, polymer 12 normally narrows as the device 90 deflects in a vertical direction. However, because of the outer attachment with added material 70b, the added material 70c pulls outwards on the polymer 12 and causes the polymer 12 to widen as it vertically elongates, thereby reducing or preventing inward edge contraction of polymer 12 as device 90 vertically elongates.

The elastic modulus of added material 70c, when it includes a material different from polymer 12, may be then selected to provide a certain force on the edges of polymer 12. The material may be selected to include a Poisson's ratio that keeps outer lateral edges of polymer 12 from moving inward as the polymer deflects but does not outwardly pull too hard on the lateral edges of polymer 12 to induce added stresses. In a specific embodiment, added material 70c includes a lower elastic modulus than polymer 12. In general added material 70 may include any compliant material. Suitable examples include stretchable fabrics with elastic fibers such as Lycra Brand elastane stretchable fabrics made by Invista headquartered in Wichita, Kans. or the aforementioned elastic woven fabrics from Shindo, other stretchable fabrics where the stretch derives from the deformation of a diamond or hexagonal mesh such as tulle fabric or elastomers such as natural rubber, polyurethanes or neoprene rubber, for example.

Figure 10:
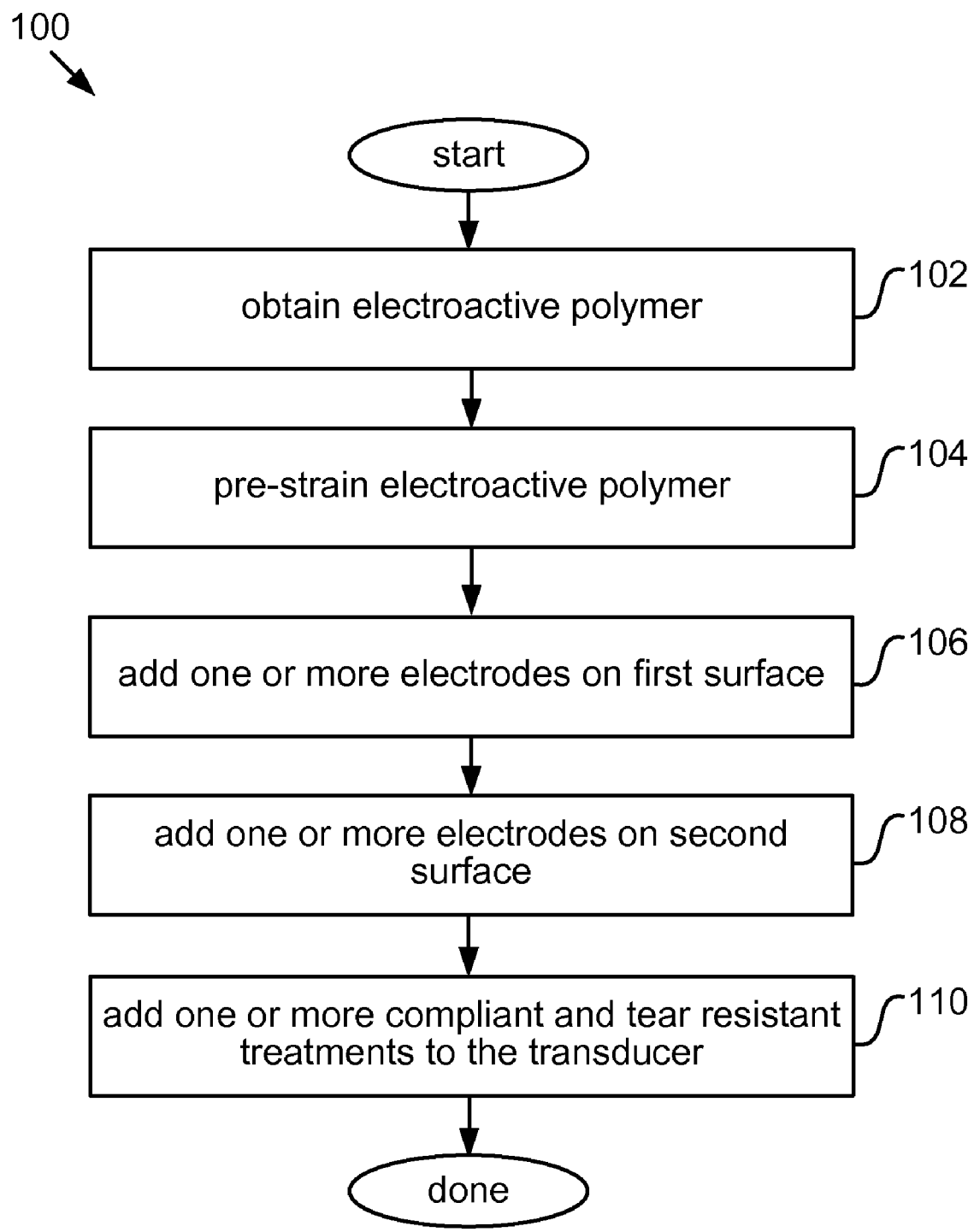
FIG. 10 shows a method for fabricating an electroactive polymer transducer in accordance with one embodiment of the present invention.

The present invention also includes methods of manufacturing electroactive polymer transducers. FIG. 10 shows a method 100 for constructing an electroactive polymer transducer in accordance with one embodiment of the present invention. Methods and processes in accordance with the present invention may include up to several additional steps not described or illustrated here in order not to obscure the present invention. In some cases, fabrication processes may include conventional materials and techniques such as commercially available polymers and techniques used in fabrication of microelectronics and electronics technologies. In addition, fabrication of devices employing electroactive polymers described herein may include additional steps not detailed in order not to obscure the present invention.

Method 100 begins by obtaining an electroactive polymer (102). Electroactive polymers suitable for use herein were described above. The polymer may also include added material 70 that reduces and prevents tear propagation when the polymer is pre-strained or deflected. Suitable geometries were described above; other added material geometries are also suitable for use.

The electroactive polymer is then pre-strained (104). Pre-strain may be achieved by a number of techniques. In one embodiment, pre-strain is achieved by mechanically stretching a polymer in or more directions and temporarily fixing it to one or more solid members (e.g., rigid plates or a manufacturing frame) while stretched. The polymer may alternatively be held temporarily in pre-strain using a suitable rigid substrate, e.g. by stretching the polymer and then attaching it to the rigid substrate. Suitable anisotropic and elastic pre-strain quantities were also described above.

Method 100 then adds a first electrode to a first surface of an electroactive polymer (106) and adds a second electrode to a second surface of an electroactive polymer (108). In a specific embodiment, one or more graphite electrodes are patterned and deposited using a mask or stencil. Electrodes comprising conductive greases mixed with a conductive silicone may be fabricated by dissolving the conductive grease and the uncured conductive silicone in a solvent. The solution may then be sprayed on the electroactive polymer material and may include a mask or stencil to achieve a particular electrode or active area pattern.

One or more compliant and tear resistant treatments are then added to the transducer (110). Partial treatments can be applied with stencils, masks, spraying techniques, brushes, draw-down bars, doctor blades and other patterning or deposition technologies known to those of skill in the art. Depending on the tear resistant treatment material(s), this step may include the use of adhesives and/or include time for cross-linking and bonding between the polymer and the treatment material or between the polymer and adhesive.

The order of steps in method 100 may vary. For example, addition of a tear resistant treatment layering may precede electrode formation, as shown in FIGS. 4A and 4B. In addition, tear resistant treatments may be applied before pre-straining or after pre-straining. A tear resistant layer can be made and added to a polymer surface before pre-straining, in which case the polymer plus tear resistant layer can be treated as a 'raw' material for electroactive polymer fabrication. If the tear resistant layer is applied after pre-straining, then the layer may have lower stiffness than in the previous case since the layer is not pre-strained. In some cases, more effective performance is achieved if the tear resistant layer is applied in a highly strained polymer state or an intermediate state since the layer does not experience large tensile stresses and thus is less likely itself to fail.

The transducer may then be added to a device, such as an electroactive polymer actuator, generator, rolled device, etc. The transducer, comprising the pre-strained polymer and electrodes, may also be packaged or further assembled according to an application. Packaging may include assembly of multiple transducers mechanically linked or stacked as multiple layers. In addition, mechanical and electrical connections to the transducers may be formed according to a particular device design.

While this invention has been described in terms of several preferred embodiments, there are alterations, permutations, and equivalents that fall within the scope of this invention which have been omitted for brevity's sake. It is therefore intended that the scope of the invention should be determined with reference to the appended claims.

What is claimed is:

1. An electroactive polymer transducer for converting between electrical and mechanical energy, the transducer comprising:
   an electroactive polymer;
   a first electrode electrically coupled to a first portion of a first surface of the electroactive polymer;
   a second electrode electrically coupled to a second portion of a second surface of the electroactive polymer; and
   a compliant material adapted to prevent a tear from propagating in the electroactive polymer, wherein the compliant material is coupled to the electroactive polymer proximate to an edge portion of the electroactive polymer, and includes a substantially sized opening toward the center of the electroactive polymer that does not have any compliant material.

2. The transducer of claim 1 wherein the compliant material adapted to prevent a tear from propagating includes added material coupled to the electroactive polymer and disposed outside polymer material in an active area related to the first electrode and the second electrode, wherein the added material is configured to reduce stress or strain in electroactive polymer material outside the active area when the electroactive polymer transducer is deflected or pre-strained.

3. The transducer of claim 1, wherein the tear resistant material comprises polychloroprene-based rubber.

4. An electroactive polymer transducer for converting between electrical and mechanical energy, the transducer comprising:
   an electroactive polymer;
   a first electrode electrically coupled to a first portion of a first surface of the electroactive polymer;
   a second electrode electrically coupled to a second portion of a second surface of the electroactive polymer; and
   an added compliant and tear resistant material mechanically coupled to the electroactive polymer and disposed outside polymer material in an active area related to the first electrode and the second electrode, wherein the added material is configured to reduce stress or strain in electroactive polymer material outside the active area when the electroactive polymer transducer is deflected or pre-strained, and wherein the added material includes a substantially sized opening toward the center of the electroactive polymer that does not have any compliant material.

5. The transducer of claim 4 wherein the compliant and tear resistant material is coupled proximate to an edge portion of the electroactive polymer.

6. The transducer of claim 5 wherein the compliant and tear resistant material is configured to prevent propagation of a crack or tear located at an edge of the electroactive polymer.

7. The transducer of claim 4 wherein the compliant tear resistant material has an elastic modulus less than about 50 MPa.

8. The transducer of claim 7 wherein the compliant tear resistant material includes rubber.

9. The transducer of claim 4 wherein the compliant tear resistant material includes a fibrous material.

10. The transducer of claim 9 wherein the fibrous material includes a woven material or a non-woven material.

11. The transducer of claim 4, wherein the added material comprises polychloroprene-based rubber.

12. An electroactive polymer transducer for converting between electrical and mechanical energy, the transducer comprising:
   an electroactive polymer;
   a first electrode electrically coupled to a first portion of a first surface of the electroactive polymer;
   a second electrode electrically coupled to a second portion of a second surface of the electroactive polymer; and
   a compliant and tear resistant material coupled to the electroactive polymer proximate to an edge portion of the electroactive polymer, wherein the compliant and tear resistant material includes a substantially sized opening toward a center portion of the electroactive polymer.

13. The transducer of claim 12 wherein the compliant tear resistant material is configured to prevent propagation of a crack or tear located at an edge of the electroactive polymer.

14. An electroactive polymer transducer for converting between electrical and mechanical energy, the transducer comprising:
   an electroactive polymer;
   a first electrode electrically coupled to a first portion of a first surface of the electroactive polymer;
   a second electrode electrically coupled to a second portion of a second surface of the electroactive polymer,
   wherein the first electrode and second electrode contribute to define an active area of the electroactive polymer transducer; and
   added material coupled to the electroactive polymer and disposed outside polymer material in the active area, wherein the added material is a compliant material, wherein the added material is configured to reduce stress or strain in electroactive polymer material outside the active area when the electroactive polymer transducer is deflected or pre-strained, wherein the added material includes a substantially sized opening toward the center of the electroactive polymer that does not include any of the added material.

15. The transducer of claim 14 wherein the added material includes added electroactive polymer material configured to reduce stress or strain in the electroactive polymer outside the active area when the electroactive polymer transducer is deflected or pre-strained.

16. The transducer of claim 14, wherein the added material comprises polychloroprene-based rubber.

17. The transducer of claim 14, wherein the added material is used to attach the transducer to a rigid constraint.

18. An electroactive polymer transducer for converting between electrical and mechanical energy, the transducer comprising:
   an electroactive polymer defining a substantially flat material having top and bottom surfaces and an outer circumference therearound;
   a first electrode electrically coupled to a first portion of the top surface of the electroactive polymer;
   a second electrode electrically coupled to a second portion of the bottom surface of the electroactive polymer; and
   one or more compliant layers adapted to prevent a tear from propagating in the electroactive polymer, wherein the one or more compliant layers are coupled to one or both of the top and bottom surfaces of the electroactive polymer proximate to an edge portion of the electroactive polymer, and wherein said one or more compliant layers do not include any center portion proximate to the center of the electroactive polymer.

19. The transducer of claim 18, wherein said one or more compliant layers includes a tear resistant layer defining a centerless ring that is coupled to the top surface of the electroactive polymer proximate to the edge and around the circumference of the electroactive polymer.

20. The transducer of claim 18, wherein said compliant tear resistant layer is adapted to prevent a tear from propagating from an edge at the outer circumference of the electroactive polymer toward the center of the electroactive polymer.

* * * * *